US008354709B2

(12) United States Patent
Schulze et al.

(10) Patent No.: US 8,354,709 B2
(45) Date of Patent: Jan. 15, 2013

(54) SEMICONDUCTOR COMPONENT WITH IMPROVED ROBUSTNESS

(75) Inventors: Hans-Joachim Schulze, Taufkirchen (DE); Josef Lutz, Chemnitz (DE)

(73) Assignee: Infineon Technologies Austria AG, Villach (AT)

( * ) Notice: Subject to any disclaimer, the term of this patent is extended or adjusted under 35 U.S.C. 154(b) by 621 days.

(21) Appl. No.: 11/865,316

(22) Filed: Oct. 1, 2007

(65) Prior Publication Data

US 2008/0128798 A1 Jun. 5, 2008

(30) Foreign Application Priority Data

Oct. 2, 2006 (DE) .......................... 10 2006 046 845

(51) Int. Cl.
*H01L 29/66* (2006.01)
(52) U.S. Cl. ................ 257/328; 257/E29.019; 438/510
(58) Field of Classification Search ................ 257/328, 257/487, E29.019; 438/510
See application file for complete search history.

(56) References Cited

U.S. PATENT DOCUMENTS

| 3,872,494 | A | 3/1975 | Davis, Jr. et al. | |
|---|---|---|---|---|
| 6,384,431 | B1 | 5/2002 | Takahashi et al. | |
| 2005/0133857 | A1 | 6/2005 | Mauder et al. | |
| 2005/0133858 | A1* | 6/2005 | Banerjee et al. | 257/327 |
| 2006/0035436 | A1 | 2/2006 | Schulze | |
| 2006/0211179 | A1 | 9/2006 | Siemieniec | |
| 2006/0286753 | A1* | 12/2006 | Barthelmess et al. | 438/282 |

FOREIGN PATENT DOCUMENTS

| DE | 3932490 | 5/1998 |
|---|---|---|
| DE | 10053445 | 11/2002 |
| DE | 10245091 | 4/2004 |
| DE | 10360574 | 7/2005 |
| DE | 102004039209 | 2/2006 |
| DE | 102005009000 | 9/2006 |

OTHER PUBLICATIONS

Hower, Philip L., "Avalanche Injection and Second Breakdown in Transistors," IEEE Transactions on Electron Devices, vol. ED-17, No. 4, pp. 320-335 (Apr. 1970).
Egawa, Hideharu, "Avalanche Characteristics and Failure Mechanism of High Voltage Diodes," IEEE Transactions on Electron Devices, vol. ED-13, No. 11, pp. 754-758 (Nov. 1966).
Soelkner, G. et al., "Charge Carrier Avalanche Multiplication in High-Voltage Diodes Triggered by Ionizing Radiation," IEEE Transactions on Nuclear Science, vol. 47, No. 6, pp. 2365-2372 (Dec. 2000).
Kaindl, W. et al., "Physically Based Simulation of Strong Charger Multiplication Events in Power Devices Triggered by Incident Ions," Proceedings of 2004 International Symposium on Power Semiconductor Devices & ICs, Kitakyushu, pp. 257-260 (2004).

* cited by examiner

*Primary Examiner* — Shaun Campbell
(74) *Attorney, Agent, or Firm* — Dicke, Billig & Czaja, PLLC

(57) ABSTRACT

One aspect is a semiconductor component including a terminal zone; a drift zone of a first conduction type, which is doped more weakly than the terminal zone; a component junction between the drift zone and a further component zone; and a charge carrier compensation zone of the first conduction type, which is arranged between the drift zone and the terminal zone and whose doping concentration is lower than that of the terminal zone, and whose doping concentration increases at least in sections in the direction of the terminal zone from a minimum doping concentration to a maximum doping concentration, the minimum doping concentration being more than $10^{16}$ cm$^{-3}$.

21 Claims, 6 Drawing Sheets

SEMICONDUCTOR COMPONENT WITH IMPROVED ROBUSTNESS

CROSS-REFERENCE TO RELATED APPLICATIONS

This Utility patent application claims priority to German Patent Application No. DE 10 2006 046 845.7, filed on Oct. 2, 2006, which is incorporated herein by reference.

BACKGROUND

One aspect relates to a semiconductor component, and a power semiconductor component, having a drift zone and a terminal zone of a first conduction type and having a component junction between the drift zone and a further component zone.

In semiconductor components of this type, such as diodes, bipolar transistors or MOSFETs, for example, a space charge zone or an electric field propagates in the drift zone in the off-state case proceeding from the component junction, for example a pn junction or a Schottky junction. The ability of the drift zone to take up such a space charge zone and thus a reverse voltage present at the component is dependent on the doping concentration of the drift zone and the dimension thereof between the component junction and the terminal zone.

In the off state, that is to say when a high electric field is present in the drift zone, semiconductor components are susceptible to so-called cosmic radiation, which can lead in the extreme case to a destruction of the component. Primary cosmic radiation includes very high-energy particles which arise outside the Earth's atmosphere and which generate secondary particles, including protons and neutrons, when they impinge on the Earth's atmosphere. These secondary particles, which pass down to the Earth, can generate a local plasma of charge carriers when they impinge on a semiconductor atom of a power semiconductor component. If a high electric field is present at the component at the instant when this secondary particle impinges, then charge carriers are generated in high density as a result of impact ionization at this location, whereby a local avalanche breakdown takes place, which, within a few hundred picoseconds (ps), leads to a local flooding of the component, of the drift zone, with charge carriers. A local filament is formed.

The robustness of a component to withstand cosmic radiation can be increased by lowering the doping concentration of the drift zone of the component, in order to achieve a so-called punch-through doping (PT doping) of the component. In these components, however, the width of the drift zone (that is a geometric feature) should be increased in order to avoid current chopping during switching operations, that is to say a high gradient of the current flow, which can result in an intense voltage spike and in electromagnetic interference in leads. However, increasing the width of the drift zone brings about increased switching and on-state losses of the component.

SUMMARY

A semiconductor component according to an embodiment includes a terminal zone, a drift zone or base zone of a first conduction type, which is doped more weakly than the terminal zone, and also a component junction between the drift zone and a further component zone. A charge carrier compensation zone of the first conduction type is additionally arranged between the drift zone and the terminal zone, and said charge carrier compensation zone's doping concentration is lower than that of the terminal zone, and its doping concentration increases at least in sections in the direction of the terminal zone from a minimum doping concentration to a maximum doping concentration, the minimum doping concentration being more than $10^{16}$ cm$^{-3}$.

Said charge carrier compensation zone, the doping concentration of which is higher than the doping concentration of field stop zones of conventional semiconductor components, ensures, in an operating state in which charge carriers flood the drift zone on account of an impact ionization, that the electrical charge of at least some of said charge carriers is compensated for by an opposite countercharge brought about by the charge carrier compensation zone. This at least partial compensation prevents the charge carriers that flood the drift zone from being able to generate, in the region of a transition to the more highly doped terminal zone, a second high field by means of which a second avalanche breakdown occurs in said region. The charge carrier compensation zone can increase the cosmic radiation resistance of this component to the effect that given otherwise identical properties a 50% to 70% higher voltage than in the case of a conventional component is required across the drift zone in order to bring about a destruction of the component in the case where the drift zone is flooded with charge carriers generated by impact ionization caused by cosmic radiation.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Examples of the present are explained in more detail below with reference to figures. In the figures, unless indicated otherwise, identical reference symbols designate identical component regions with the same meaning.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
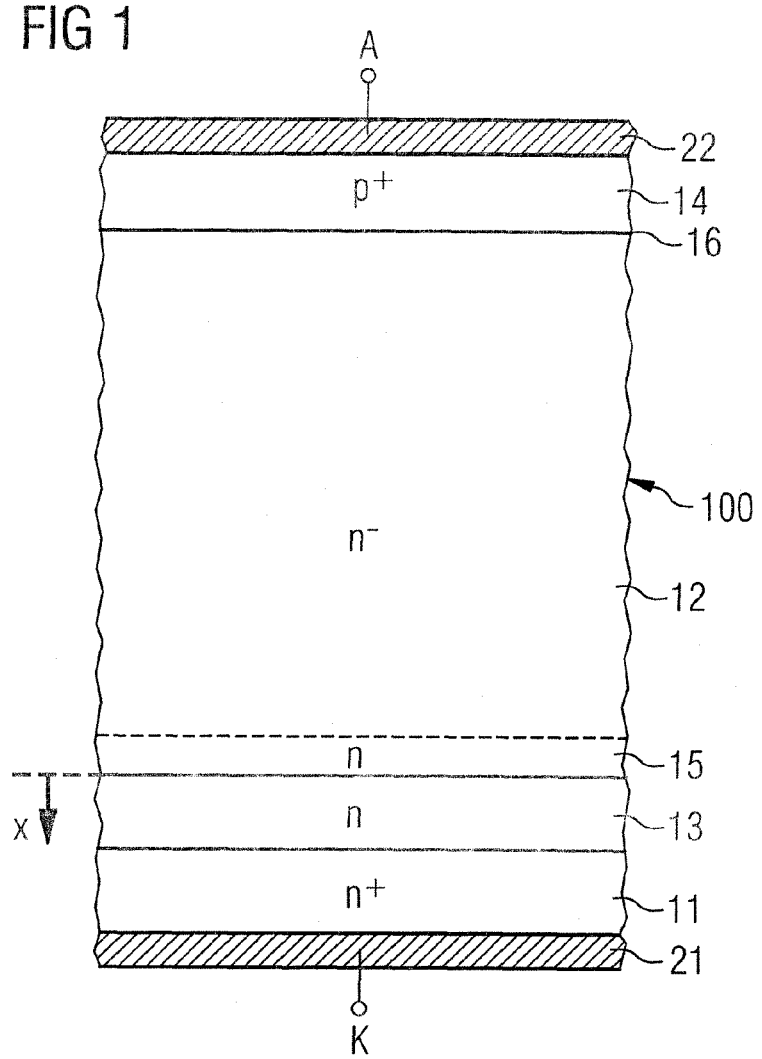
FIG. 1 illustrates in cross section a power semiconductor component formed as a diode in accordance with one example with a charge carrier compensation zone arranged between a drift zone and a terminal zone.

FIG. 1 illustrates in cross section a part of a semiconductor component that is formed as a power diode. This component includes in a semiconductor body 100 a drift zone 12 of a first conduction type, which is also referred to as base zone in the case of a diode.

It shall be assumed for the explanation below that semiconductor zones of the first conduction type are n-doped semiconductor zones. It goes without saying, however, that n-doped zones of the components explained below can, of course, also be realized as p-doped zones, and p-doped zones can correspondingly be realized as n-doped zones.

The diode in accordance with FIG. 1 additionally has a first terminal zone 11 of the same conduction type as the drift zone 12, but it is doped very much more highly than the drift zone 12. In the diode illustrated in FIG. 1, said first terminal zone 11 forms an n-type emitter zone or cathode zone, with which contact is made by a terminal electrode 21. Said terminal electrode 21 forms a cathode terminal K of the diode. The component additionally has a component junction, in the present case a pn junction between the drift zone 12 and a second terminal zone 14 doped complementarily with respect to the drift zone 12. Said second terminal zone 14 forms a p-type emitter zone or anode zone of the diode, is adjacent to the drift zone at a side opposite to the n-type emitter 11 and contact is made with said second terminal zone by a second terminal electrode 22, which forms an anode terminal A of the diode.

In addition, the component has a charge carrier compensation zone 13, which is arranged between the drift zone 12 and the n-type emitter 11 and which is of the same conduction type as the drift zone 12 and the n-type emitter 11. A doping concentration of said charge carrier compensation zone 13 increases at least in sections in the direction of the n-type emitter 11. In this case, the charge carrier compensation zone brings about an increase in the cosmic radiation resistance.

Figure 2:
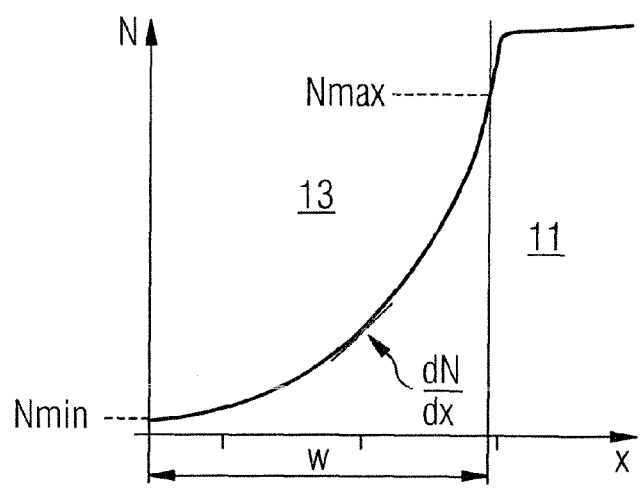
FIG. 2 illustrates the doping profile in the charge carrier compensation zone.

FIG. 2 illustrates, on the basis of a profile of the doping concentration N of the charge carrier compensation zone 13, the special case where the doping concentration of the charge carrier compensation zone 13 increases continuously over the entire width w thereof. In this case, the width w denotes the dimensions of the charge carrier compensation zone 13 in a direction between the drift zone 12 and the n-type emitter 11. A minimum doping concentration Nmin, that is to say a minimum concentration of dopants of the charge carrier compensation zone 13, is more than $10^{16}$ cm$^{-3}$ and therefore lies above the doping concentration of conventional field stop zones.

According to an example the minimum doping concentration Nmin is between $2 \cdot 10^{16}$ cm$^{-3}$ and $1 \cdot 10^{17}$ cm$^{-3}$. A maximum doping concentration Nmax of the charge carrier compensation zone 13 can be between $1 \cdot 10^{18}$ cm$^{-3}$ and $5 \cdot 10^{18}$ cm$^3$. Besides the minimum doping concentration Nmin and the maximum doping concentration Nmax, an increase in the doping concentration in the direction of the n-type emitter 11, which is designated as x-direction in FIGS. 1 and 2, is a further parameter that influences the mode of operation of the charge carrier compensation zone, which will be explained below. In the illustration in accordance with FIG. 2, said increase in the doping concentration corresponds to a change dN/dx in the doping profile in the charge carrier compensation zone 13 in direction x of the n-type emitter 11. According to an example said change—the gradient in the present case— in the doping concentration in the direction of the n-type emitter is at most $2 \cdot 10^{21}$ cm$^{-4}$. The change in the doping concentration at least in a region, of the compensation zone 13, in which the doping concentration rises from $5 \cdot 10^{16}$ cm$^{-3}$ to $2 \cdot 10^{17}$ cm$^{-3}$ may be at most $2 \cdot 10^{21}$ cm$^{-4}$ or to be at most $2 \cdot 10^{20}$ cm$^{-4}$. While the maximum gradient of the doping concentration may be in the range of $2 \cdot 10^{20}$ cm$^{-4}$ to $2 \cdot 10^{21}$ cm$^{-4}$ a minimum gradient of the doping concentration in the compensation zone 13, or at least in those areas of the compensation zone 13 in which the doping concentration rises from $5 \cdot 10^{16}$ cm$^{-3}$ to $2 \cdot 10^{17}$ cm$^{-3}$, is about $10^{18}$ cm$^{-4}$, that is, the gradient of the doping concentration is at least about $10^{18}$ cm$^{-4}$. Alternatively the minimum gradient of the doping concentration in the compensation zone 13, or at least in those areas of the compensation zone 13 in which the doping concentration rises from $5 \cdot 10^{16}$ cm$^{-3}$ to $2 \cdot 10^{17}$ cm$^{-3}$, is between 0.5% and 3% of the maximum doping concentration, for example about 1% of the maximum doping concentration.

In comparison with the doping concentration of the charge carrier compensation zone 13, the doping concentration of the n-type emitter is higher and for example about $10^{19}$ cm$^{-3}$ and greater. The doping concentration of the drift zone 12 lies for example within the range of $10^{13}$ cm$^{-3}$ to $10^{14}$ cm$^{-3}$ and is given by the desired dielectric strength of the component.

FIG. 2 does not illustrate a transition from a section of the charge carrier compensation zone 13 having a minimum doping concentration Nmin to the even smaller doping concentration of the drift zone 12. Said transition can be effected arbitrarily steeply, that is to say with an arbitrarily high gradient of the doping concentration. This transition zone still belongs to the drift zone in the sense of the present application. In the sense of the present application, the compensation zone 13 only begins where the doping concentration reaches the value of the minimum doping concentration Nmin.

For the explanation of the functioning of the charge carrier compensation zone 13 it shall be assumed that the component is in the off state. In the case of the power diode illustrated in FIG. 1, such an off state is present when a negative voltage is present between the anode A and the cathode K. In this case, a space charge zone or an electric field propagates in the drift zone 12 proceeding from the pn junction 16 between the drift zone 12 and the emitter zone 14, the maximum of the electric field being present at the pn junction 16. If the generation of free charge carrier pairs occurs during this operating state as a result of an impact ionization in the drift zone 12 near the pn junction 16, then the electrons are accelerated in the electric field prevailing in the drift zone 12 in the direction of the n-type emitter 11, which is at more positive potential than the drift zone, while the holes are accelerated in the direction of the p-type emitter 14. In the region of the impact ionization that occurred, an avalanche breakdown occurs at the pn junction 16 and generates further free charge carriers, which flood the drift zone.

In the component illustrated, the charge carrier compensation zone 13 serves to prevent, during this operation in which free electrons move at high speed in the direction of the n-type emitter 11, a second avalanche breakdown in the region of the n-type emitter 11.

During the operating state explained, the dopant atoms are ionized when the electric field penetrates into the charge carrier compensation zone 13, such that in the charge carrier compensation zone 13 during this operating state positively charged donor cores are present in a concentration corresponding to the doping concentration of the charge carrier compensation zone 13. Said positively charged donor cores represent a countercharge with respect to the n-type charge carriers or electrons which are generated by the impact ionization and advance in the direction of the n-type emitter 11. This countercharge in the form of the donor cores provides for a reduction of the electric field in the transition region with respect to the n-type emitter 11 in comparison with a component in which such a charge carrier compensation zone 13 is not present.

Figure 3:
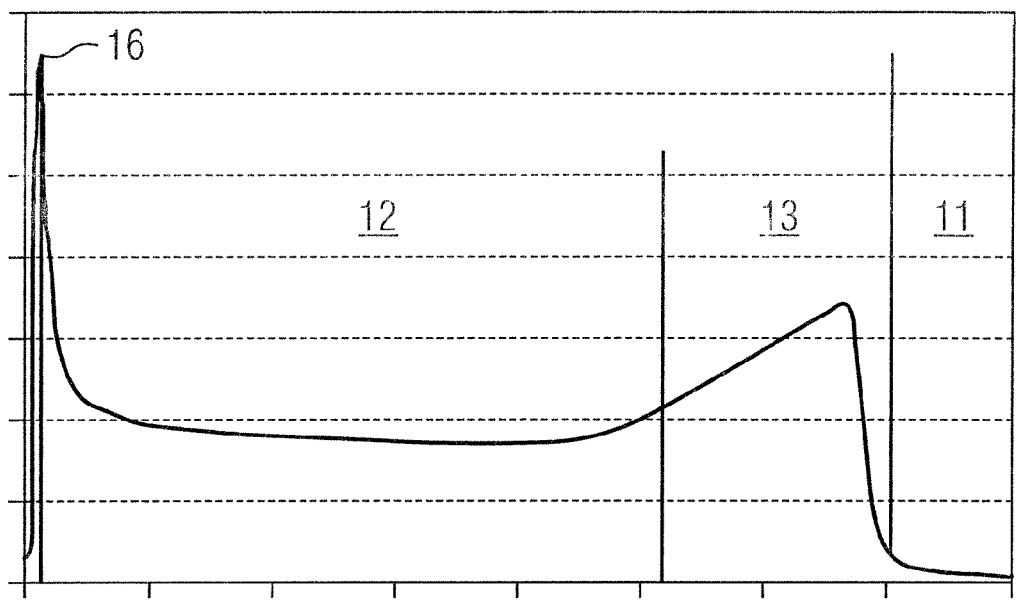
FIG. 3 schematically illustrates the profile of an electric field in the drift zone and the charge carrier compensation zone of the semiconductor component in the off-state case after an impact ionization that has occurred.

FIG. 3 schematically illustrates the profile of the electric field E in the component during the off state and in the event of a very high charge carrier flow in the direction of the n-type emitter 11 that is generated by a secondary particle of a cosmic radiation and subsequent impact ionization at the pn junction. The field strength is plotted in FIG. 3 against the total length of the drift path 12 and the charge carrier compensation zone 13, that is to say proceeding from the pn junction 16 between the p-type emitter 14 and the drift zone 12 as far as the n-type emitter 11. In this case, a first voltage spike of the electric field is present at the pn junction between the p-type emitter 14 and the drift zone 12, in which case an avalanche breakdown is present here and the electric field can reach magnitudes in the region of up to 300 kV/cm. In the charge carrier compensation zone 13, although the electric field rises in the direction of the n-type emitter 11, a rise in the electric field is limited due to the donor cores present in the charge carrier compensation zone 13 during the operating state illustrated. The field strength remains below 150 kV/cm here for silicon as semiconductor material, such that no avalanche breakdown is present.

The slower rise—effected by the charge carrier compensation zone 13—of the electric field in the region of the n-type emitter 11 has the effect that a maximum permissible reverse voltage at which an impact ionization can lead to an avalanche breakdown in the region of the n-type emitter, and hence to a destruction of the component, can be significantly higher than in the case of conventional components without such a charge carrier compensation zone. Calculations have illustrated that in the case of two identical components, which differ only by virtue of the presence of a charge carrier compensation zone in one of the components, the maximum voltage in the component with a charge carrier compensation zone can be higher by 50% to 70% than in the component without a charge carrier compensation zone.

Figure 4:
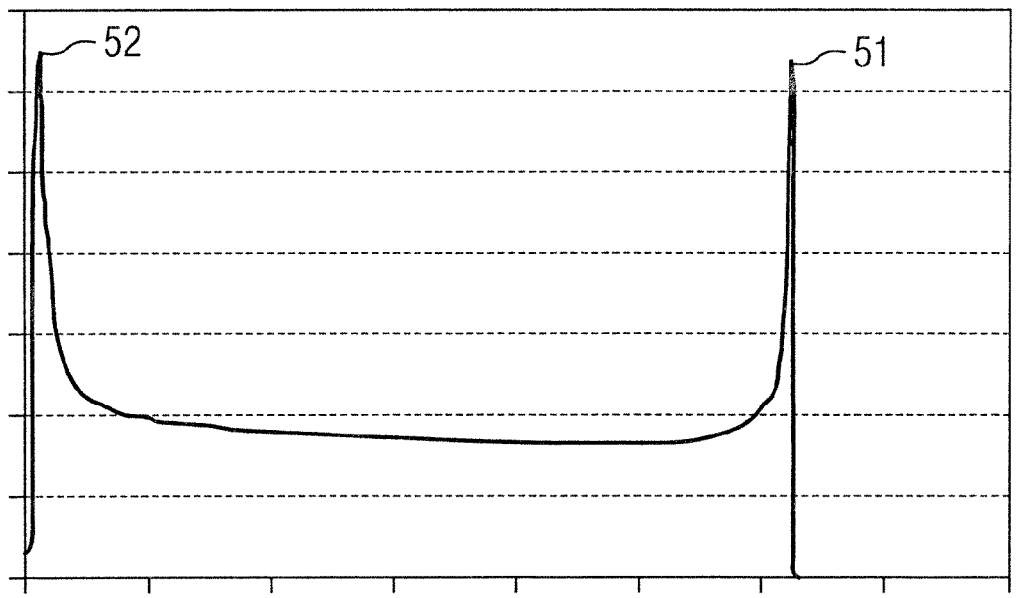
FIG. 4 illustrates the profile of the electric field in the drift zone of a conventional component without a charge carrier compensation zone.

FIG. 4 illustrates, in contrast thereto, the profile of the electric field in a conventional diode in which a charge carrier compensation zone 13 is not present and in which the drift zone directly adjoins the n-type emitter. In this component, under the condition of the same electron current as in FIG. 3, that is to say in the case of a strong electron flow in the direction of the n-type emitter zone 11 that is generated by the secondary particle of the cosmic radiation and avalanche breakdown, in the region of a junction between the drift zone and the n-type emitter, a second field spike is present, which is designated by the reference symbol 51 in FIG. 4 and which can lead to a second avalanche breakdown of the component at the n-type emitter 11. The reference symbol 52 in FIG. 4 designates the first field spike—already explained with reference to FIG. 3—in the region of the pn junction between the p-type emitter and the drift zone.

Referring to FIG. 1, there is optionally the possibility of providing a field stop zone 15 between the drift zone 12 and the charge carrier compensation zone 13, said field stop zone being doped more highly than the drift zone 12 and more lightly than the minimum doping concentration of the charge carrier compensation zone 13. The doping concentration of said field stop zone lies for example between $10^{14}$ cm$^{-3}$ and $10^{16}$ cm$^{-3}$. Said field stop zone can be realized, in such a way that its doping concentration rises in the direction of the charge carrier compensation zone 13 within the abovementioned doping limits.

It goes without saying that the concept explained above of providing a charge carrier compensation zone having an increasing doping concentration between the drift zone and a terminal zone in a power semiconductor component is not restricted to the bipolar power diode explained up to this point.

Figure 5:
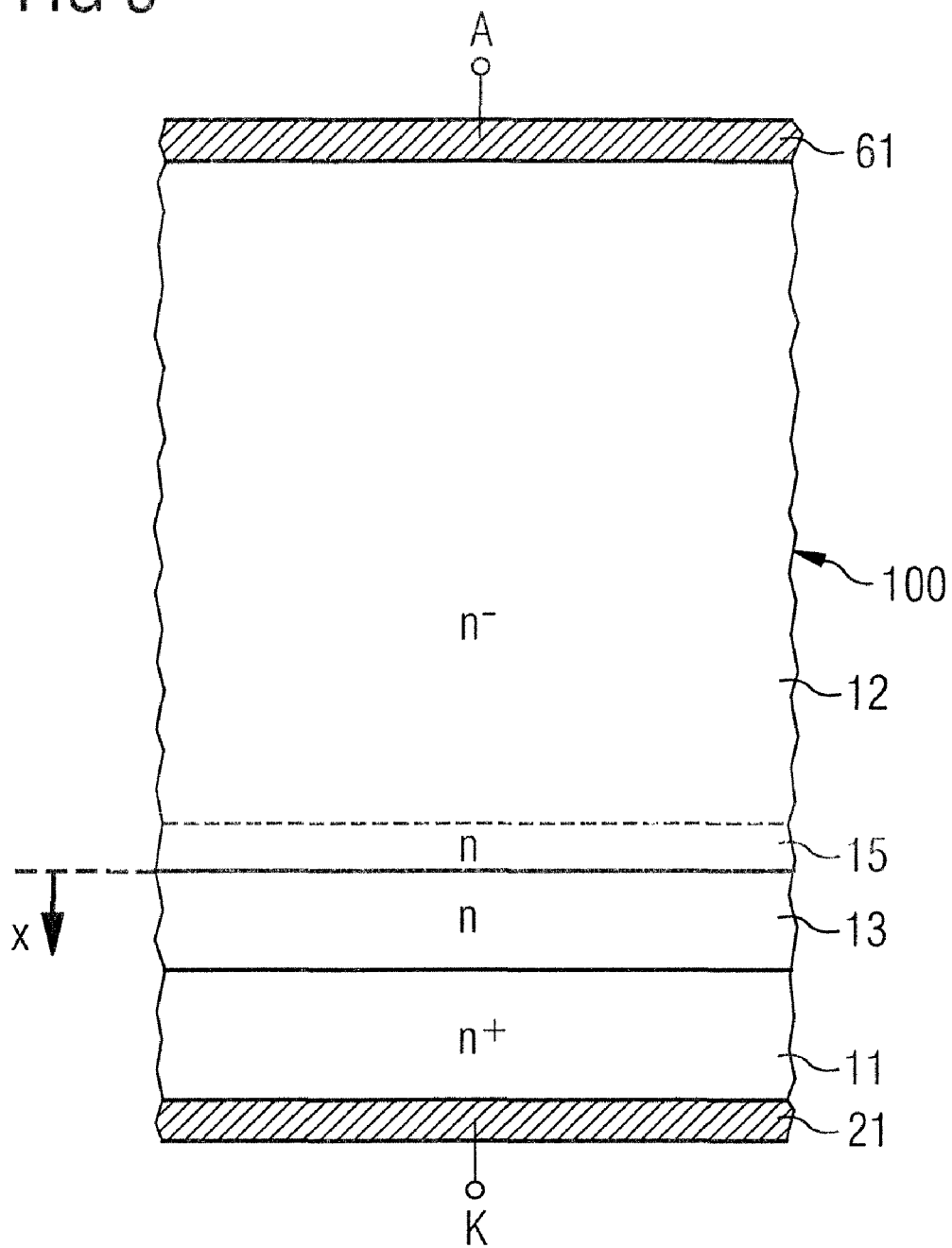
FIG. 5 illustrates in cross section a semiconductor component formed as a Schottky diode.

Referring to FIG. 5, the explained concept can also be applied to Schottky diodes, for example. Such a Schottky diode differs from the bipolar diode illustrated in FIG. 1 essentially by virtue of the fact that a metal layer 61 is present instead of a p-type emitter, which metal layer forms a Schottky junction with the drift zone 12.

Figure 6:
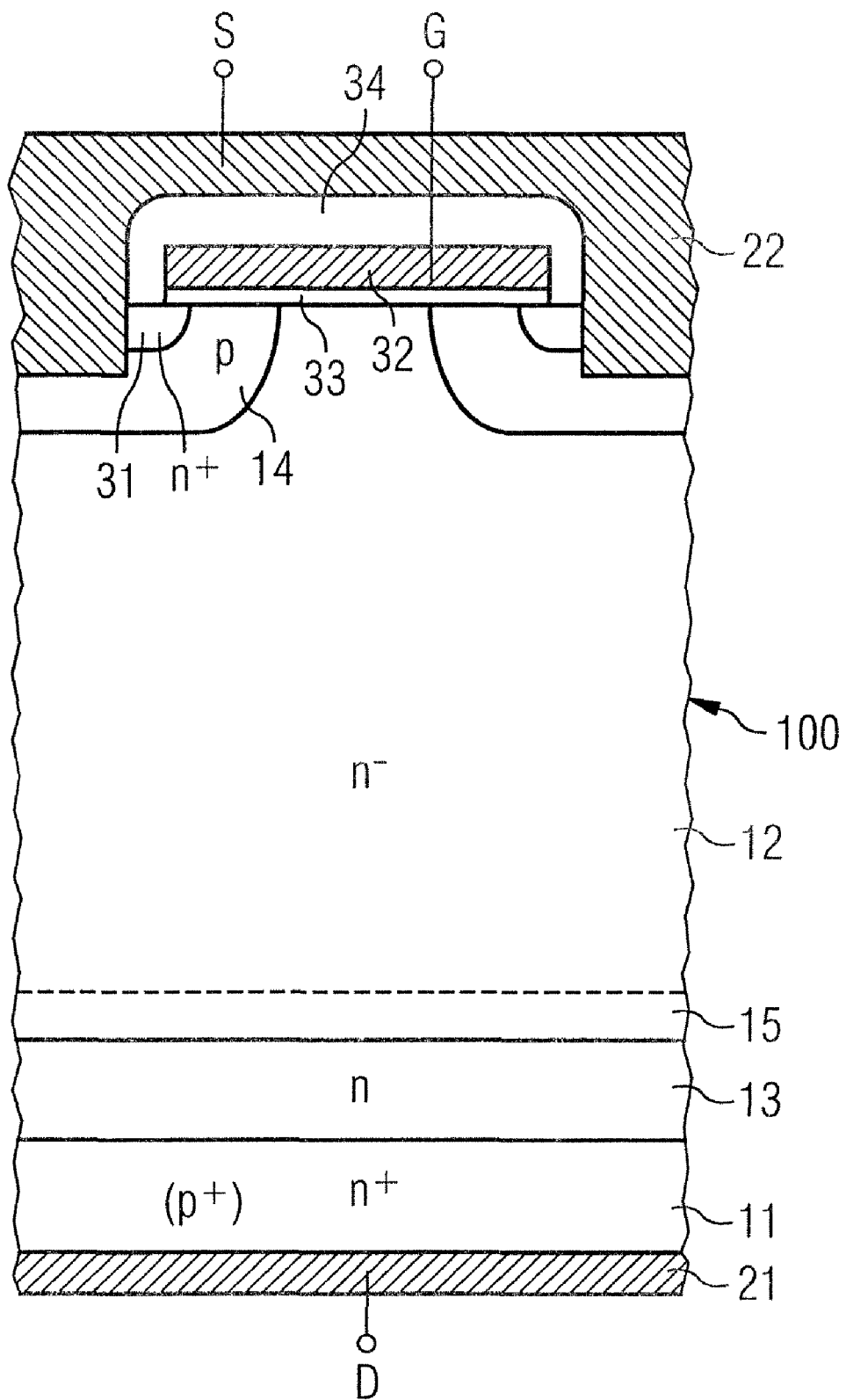
FIG. 6 illustrates in cross section a semiconductor component formed as a MOS transistor.

Referring to FIG. 6, the explained concept of providing a charge carrier compensation zone can also be applied to a power MOSFET. FIG. 6 illustrates a section of such a power MOSFET, which is realized as an n-channel MOSFET in the example. Said MOSFET has a drift zone 12 and a first terminal zone 11 of the same conduction type, between which a charge carrier compensation zone 13 is arranged. A field stop zone 15 is optionally present between the charge carrier compensation zone 13 and the drift zone 12. These semiconductor zones are n-doped in the case of the component illustrated in FIG. 6.

The first terminal zone 11 forms a drain zone of the MOSFET, with which contact is made by a drain electrode 21 forming a drain terminal D. The component illustrated is realized as a vertical power component. In the direction of a front side 101 of the semiconductor body 100, a body zone 14 doped complementarily with respect to the drift zone 12 is in this case adjacent to the drift zone 12, and is connected to a source electrode 22. A source zone 31 doped complementarily with respect to the body zone 14 is separated from the drift zone 12 by the body zone 14. A gate electrode 32 is present for controlling an inversion channel in the body zone 14 between the source zone 31 and the drift zone 12, said gate electrode being dielectrically insulated from the semiconductor body by a gate dielectric 33.

The transistor illustrated is realized as a planar transistor. In this transistor, the gate electrode 32 is arranged above the front side 101 of the semiconductor body and the drift zone 12 extends in sections up to said front side 101. It should be pointed out that this realization should be understood merely as an example, and that arbitrary transistor structures, including trench structures, can be realized.

The MOSFET illustrated turns on when a positive voltage is applied between the drain electrode 21 and the source electrode 22 and a drive potential suitable for forming an inversion channel is applied to the gate electrode 32. The component turns off when there is a positive voltage between the drain electrode 21 and the source electrode 22 if no suitable potential is present at the gate electrode 32 for forming an inversion channel in the body zone 14. In this case, a space charge zone propagates in the drift zone 12, proceeding from the body zone 14 connected to the source electrode 22, in the direction of the drain zone 11. The behavior of the MOSFET driven in the off state corresponds to the behavior of the diode driven in the off state, such that in this regard and with regard to the functioning of the charge carrier compensation zone 13, reference is made to the explanations concerning the diode in accordance with FIG. 1.

The concept explained can furthermore also be applied to an IGBT, which differs from the MOSFET illustrated in FIG. 6 essentially in that the drain zone 11 is complementary to the drift zone 12—that is to say p-doped in the example—, which is illustrated by the doping type given in parentheses in FIG. 6.

Figure 7:
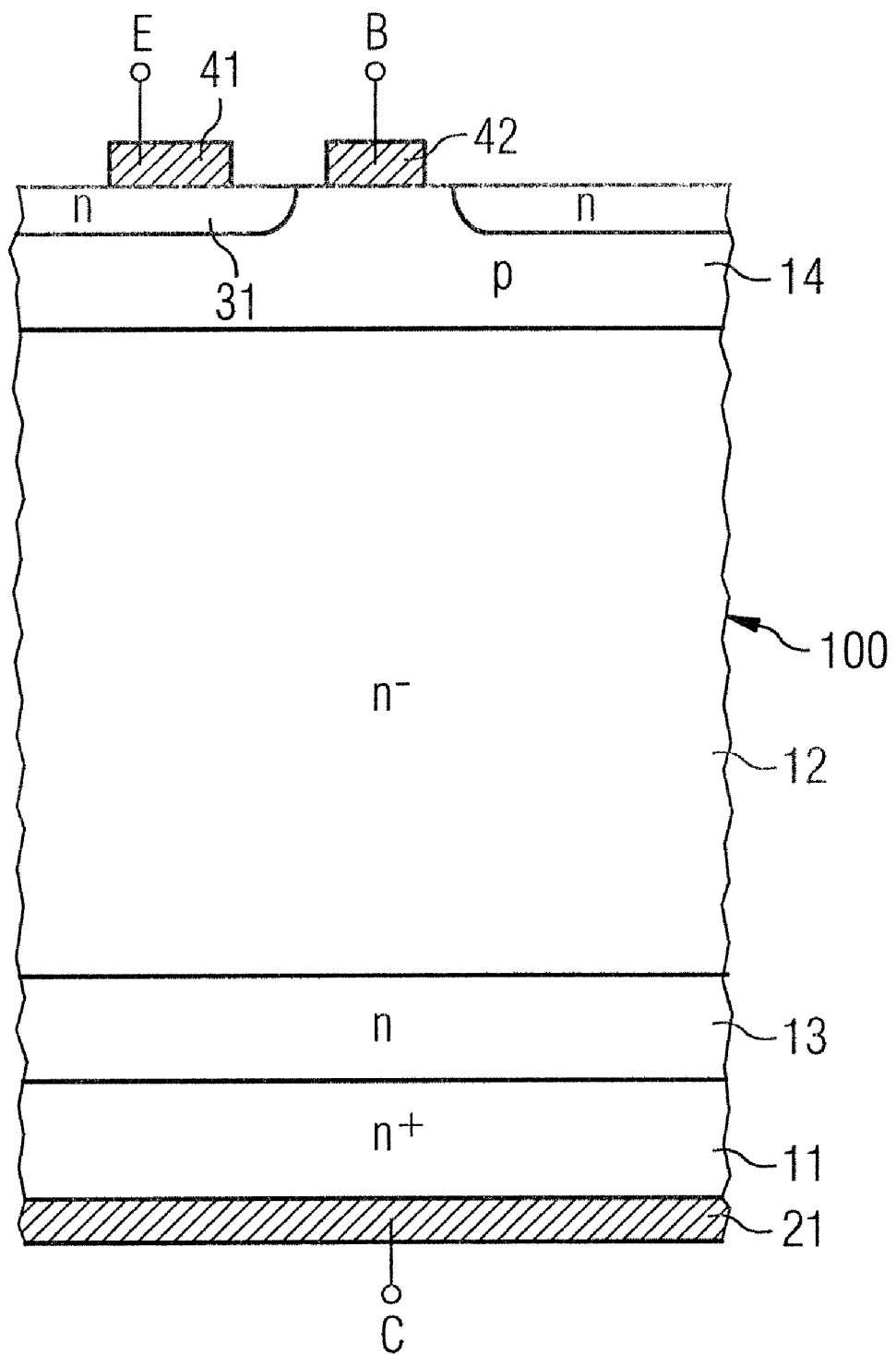
FIG. 7 illustrates in cross section a semiconductor component formed as a bipolar transistor.

FIG. 7 illustrates an example of a semiconductor component which is realized as a power bipolar transistor. The transistor illustrated is realized as an npn bipolar transistor. In this case, the component structure with the drift zone 12, the charge carrier compensation zone 13 and the terminal zone 11 corresponds to the component structures explained above with reference to the diode in FIG. 1 and the MOSFET in FIG. 6. In the case of the bipolar transistor illustrated in FIG. 7, the terminal zone 11 forms the collector zone of said transistor, with which contact is made by a collector electrode 21. In the case of this component, at a side remote from the collector zone 11 and charge carrier compensation zone 13, a component zone doped complementarily with respect to the drift zone 12 is adjacent to the drift zone 12, which component zone forms the base zone 14 of the bipolar transistor and contact is made with it by a base electrode 42. An emitter zone 31 doped complementarily with respect to the base zone 14 is separated from the drift zone 12 by the base zone 14 and connected to an emitter electrode 41.

The component turns off if a potential suitable for on-state driving is not present at the base B and if a positive voltage is present between the collector terminal C and the emitter terminal E. In this case, a space charge zone propagates within the drift zone 12 in the direction of the emitter zone 11 proceeding from the pn junction between the base zone 14 and the drift zone 12. The behavior of this component in the off state corresponds to the behavior of the diode explained with reference to FIG. 1 and of the MOSFET explained with reference to FIG. 6 in the off state, such that in this regard reference is made to the explanations concerning said components.

Figure 8:
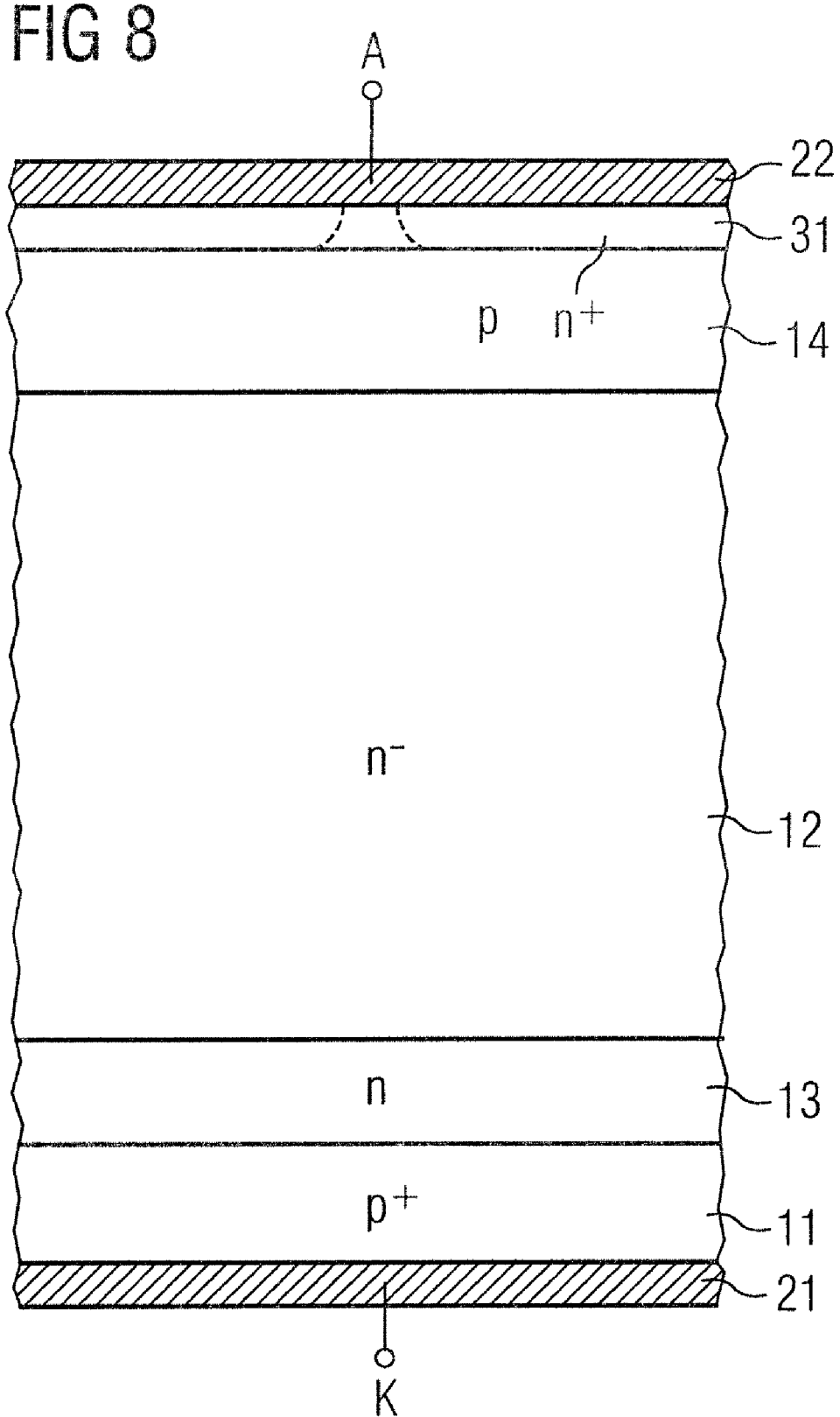
FIG. 8 illustrates in cross section a semiconductor component formed as an asymmetrical thyristor.

Referring to FIG. 8, the concept explained can also be applied to an asymmetrical thyristor. Said thyristor includes a p-type emitter 11, a charge carrier compensation zone 13 adjacent to the p-type emitter 11, and an n-type base or drift zone 12 adjacent to the charge carrier compensation zone. A p-type base 14, in which an n-type emitter 31 is arranged, is adjacent to the n-type base 12. Contact is made with the n-type emitter 31 by an anode electrode 22, in which case the p-type base 14 can reach as far as the anode electrode 22 in sections in the region of so-called anode short circuits. Contact is made with the p-type emitter 11 by a cathode electrode 21. A triggering structure is not illustrated in the thyristor in accordance with FIG. 8. Said triggering structure can be a conventional thyristor triggering structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a terminal zone;
a drift zone of a first conduction type, which is doped more weakly than the terminal zone;
a component junction between the drift zone and a further component zone; and
means arranged between the drift zone and the terminal zone for increasing cosmic radiation resistance of the semiconductor component;
wherein the means for increasing cosmic radiation resistance comprises a charge carrier compensation zone with a minimum doping concentration being more than $10^{16}$ cm$^{-3}$;
wherein the rate of change in the doping concentration in the charge carrier compensation zone in the direction of the terminal zone in a region in which the doping rises from $5 \cdot 10^{16}$ cm$^{-3}$ to $2 \cdot 10^{17}$ cm$^{-3}$ is at most $2 \cdot 10^{21}$ cm$^{-4}$; and
wherein the doping concentration of the drift zone is within the range of $10^{13}$ cm$^-$ and $10^{14}$ cm$^{-3}$.

2. A semiconductor component comprising:
a terminal zone;
a drift zone of a first conduction type, which is doped more weakly than the terminal zone;
a component junction between the drift zone and a further component zone; and
a charge carrier compensation zone of the first conduction type, which is arranged between the drift zone and the terminal zone and whose doping concentration is lower than that of the terminal zone, and whose doping concentration increases at least in sections in the direction of the terminal zone from a minimum doping concentration to a maximum doping concentration, the minimum doping concentration being more than $10^{16}$ cm$^{-3}$; wherein the rate of change in the doping concentration in the charge carrier compensation zone in the direction of the terminal zone in a region in which the doping rises from $5 \cdot 10^{16}$ cm$^{-3}$ to $2 \cdot 10^{17}$ cm$^{-3}$ is at most $2 \cdot 10^{21}$ cm$^{-4}$; and
wherein the doping concentration of the drift zone is within the range of $10^{13}$ cm$^-$ and $10^{14}$ cm$^{-3}$.

3. The semiconductor component of claim 2, wherein a minimum doping concentration of the charge carrier compensation zone is between $2 \cdot 10^{16}$ cm$^{-3}$ and $2 \cdot 10^{17}$ cm$^{-3}$.

4. The semiconductor component as claimed in claim 2, wherein a minimum doping concentration of the charge carrier compensation zone is between $5 \cdot 10^{16}$ cm$^{-3}$ and $1 \cdot 10^{17}$ cm$^{-3}$.

5. The semiconductor component of claim 2, wherein a maximum doping concentration of the charge carrier compensation zone is between $1 \cdot 10^{18}$ cm$^{-3}$ and $5 \cdot 10^{18}$ cm$^{-3}$.

6. The semiconductor component of claim 2, wherein a rate of change in the doping concentration in the charge carrier compensation zone in the direction of the terminal zone is at most $2 \cdot 10^{21}$ cm$^{-4}$.

7. The semiconductor component of claim 2, wherein the rate of change in the doping concentration is at most $2 \cdot 10^{20}$ cm$^{-4}$.

8. The semiconductor component of claim 2, wherein a rate of change in the doping concentration in the charge carrier compensation zone in the direction of the terminal zone is at least $10^{18}$ cm$^{-4}$.

9. The semiconductor component of claim 2, wherein a minimum gradient of a doping concentration in the charge carrier compensation zone in the direction of the terminal zone is at least 0.5% to 3% of a maximum gradient of the doping concentration in the charge carrier compensation zone.

10. The semiconductor component of claim 9, wherein the minimum doping concentration is about 1% of the maximum doping concentration.

11. The semiconductor component of claim 2, wherein a dimension of the charge carrier compensation zone in a direction from the drift zone to the terminal zone is between 10 µm and 40 µm.

12. The semiconductor component of claim 2, wherein a field stop zone of the first conduction type is arranged between the drift zone and the charge carrier compensation zone, the doping concentration of which field stop zone is less than or equal to the minimum doping concentration of the charge carrier compensation zone and the doping concentration of which field stop zone is greater than the doping concentration of the drift zone.

13. The semiconductor component of claim 12, wherein the doping concentration of the field stop zone increases at least in sections in the direction of the charge carrier compensation zone.

14. The semiconductor component of claim 2, which is formed as a diode in which the terminal zone forms a first emitter zone and in which the further component zone is doped complementarily with respect to the drift zone and forms a second emitter zone.

15. The semiconductor component of claim 2, which is formed as a bipolar transistor in which the terminal zone forms a collector zone and the further component zone is doped complementarily with respect to the drift zone and forms a base zone and which furthermore has an emitter zone adjacent to the base zone and doped complementarily with respect to the base zone.

16. The semiconductor component of claim 2, which is formed as a MOS transistor in which the terminal zone forms a drain zone and the further component zone is doped complementarily with respect to the drift zone and forms a body zone and which furthermore has:
  a source zone adjacent to the body zone and doped complementarily with respect to the body zone; and
  a gate electrode arranged adjacent to the body zone and dielectrically insulated from the body zone.

17. The semiconductor component of claim 16, wherein the terminal zone is doped complementarily with respect to the drift zone.

18. The semiconductor component of claim 2, wherein component zones of the first conduction type are n-doped zones.

19. The semiconductor component of claim 18, wherein n-type dopant atoms of the charge carrier compensation zone are at least partly hydrogen-induced donors.

20. A method of producing a semiconductor component comprising:
  providing a terminal zone;
  providing a drift zone of a first conduction type that is doped more weakly than the terminal zone;
  arranging a charge carrier compensation zone of the first conduction type between the drift zone and the terminal zone; and
  doping the charge carrier compensation zone such that the doping concentration of the charge carrier compensation zone is lower than that of the terminal zone, such that the doping concentration of the charge carrier compensation zone increases at least in sections in the direction of the terminal zone from a minimum doping concentration to a maximum doping concentration, and such that the minimum doping concentration is more than $10^{16}$ cm$^{-3}$;
  wherein the rate of change in the doping concentration in the charge carrier compensation zone in the direction of the terminal zone in a region in which the doping rises from $5 \cdot 10^{16}$ cm$^{-3}$ to $2 \cdot 10^{17}$ cm$^{-3}$ is at most $2 \cdot 10^{21}$ cm$^{-4}$; and
  wherein the doping concentration of the drift zone is within the range of $10^{13}$ cm$^-$ and $10^{14}$ cm$^{-3}$.

21. A semiconductor component comprising:
  a terminal zone;
  a drift zone of a first conduction type, which is doped more weakly than the terminal zone;
  a component junction between the drift zone and a further component zone; and
  a charge carrier compensation zone of the first conduction type, which is arranged between the drift zone and the terminal zone and whose doping concentration is lower than that of the terminal zone, and whose doping concentration increases at least in sections in the direction of the terminal zone from a minimum doping concentration to a maximum doping concentration, the minimum doping concentration being more than $10^{16}$ cm$^{-3}$; wherein the rate of change in the doping concentration in the charge carrier compensation zone in the direction of the terminal zone in a region in which the doping rises from $5 \cdot 10^{16}$ cm$^{-3}$ to $2 \cdot 10^{17}$ cm$^{-3}$ is at most $2 \cdot 10^{21}$ cm$^{-4}$; and
  wherein a minimum gradient of a doping concentration in the charge carrier compensation zone in the direction of the terminal zone is at least 0.5% to 3% of a maximum gradient of the doping concentration in the charge carrier compensation zone; and
  wherein the doping concentration of the drift zone is within the range of $10^{13}$ cm$^{-3}$ and $10^{14}$ cm$^{-3}$.

* * * * *